US006669488B2

(12) United States Patent
Kaller et al.

(10) Patent No.: US 6,669,488 B2
(45) Date of Patent: Dec. 30, 2003

(54) REMOVABLE HOUSING FOR MOUNTING PIN GRID ARRAY

(75) Inventors: Dierk Kaller, Schoenaich (DE); Willi Recktenwald, Holzgerlingen (DE); Gerhard Ruehle, Sindelfingen (DE)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 10/016,446

(22) Filed: Dec. 10, 2001

(65) Prior Publication Data

US 2002/0071257 A1 Jun. 13, 2002

(30) Foreign Application Priority Data

Dec. 13, 2000 (EP) .............................. 00127303

(51) Int. Cl.[7] .............................................. H01R 12/00
(52) U.S. Cl. .......................................... 439/69; 439/71
(58) Field of Search ........................... 439/752, 69, 70, 439/71, 83, 68, 74, 80, 64, 76, 78–81, 660, 677, 680

(56) References Cited

U.S. PATENT DOCUMENTS 4,218,724 A * 8/1980 Kaufman ................... 361/736
5,168,432 A * 12/1992 Murphy et al. ............. 361/813
5,199,884 A * 4/1993 Kaufman et al. ............. 439/74
5,742,481 A * 4/1998 Murphy et al. ............. 361/767

* cited by examiner

Primary Examiner—Jean F. Duverne
(74) Attorney, Agent, or Firm—Arthur J. Samodovitz

(57) ABSTRACT

An assembly for mounting elongated electrical contact elements to an integrated circuit package or printed circuit board. The assembly comprises a a base plate having a first surface and a multiplicity of recesses aligned with each other in the first surface. Each of the recesses is sized and configured to receive a respective one of the contact elements. The assembly also comprises first and second spaced apart supports extending from the base plate. The assembly also comprises first and second rods received by the first and second supports and supported parallel to each other. The first and second rods define an intervening slot aligned with the recesses. The assembly also comprises a multiplicity of the contact elements. One end of each of the contact elements is received in a respective one of the recesses. The contact elements are engaged by the first and second rods, whereby the contact elements are held in their respective recesses. The rods are removable from the first and second supports to permit the contact elements to be removed from the base plate.

14 Claims, 4 Drawing Sheets

REMOVABLE HOUSING FOR MOUNTING PIN GRID ARRAY

FIELD OF THE INVENTION

The present invention relates generally to apparatus for mounting an array of pins onto an integrated circuit package and/or printed circuit board.

BACKGROUND OF THE INVENTION

Integrated circuit packaging technology has significantly evolved over the past several decades to meet demands for higher I/O, I/O density and power dissipation. The foremost cause for this growth has been the need to keep pace with ever increasing levels of silicon integration.

The earliest packaging solutions relied primarily on low density "pin-in hole" soldered interconnects where I/O counts were below 100 to 150. By the late '70s, a new perimeter leaded package, using surface mount technology (SMT), began to gain rapid acceptance within the low I/O range. The driving force for this change was the promise of greater manufacturing efficiencies with the result being lower cost per I/O and increased placement efficiency at the board level. The 1980s saw the establishment of SMT packaging across the board for low-cost, high-volume packaging applications of under 200 I/O for the consumer, telecommunications and portable computing markets. Various forms of quad flat pack (QFP), fine pitch and small or thin outline packages were readily assembled as a strong SMT manufacturing infrastructure was developed.

At the same time, the higher I/O needs of advanced microprocessors were being met by pin grid array (PGA) packages, driven largely by the need for pluggability and pin compatibility with successive generations of processors. However, correspondingly to the higher integration, the grid of the state of the art pin grid arrays got finer as well. This caused more effort in mounting, inspecting and maintaining such connections between integrated circuit packages and circuit boards.

U.S. Pat. No. 5,742,481 discloses an intercoupling component for use with a substrate having an array of connection regions disposed on a surface of the substrate. The intercoupling component comprises an insulative support member having an upper surface and an opposite lower surface. The support member includes an array of first holes extending transversely from the upper surface to the opposite lower surface. The array of first holes is located in a pattern corresponding to the array of the connection regions. The insulative support member has a thickness between the upper and lower surfaces greater than 25% of a largest diameter of the terminal elements. The intercoupling component further comprises a plurality of terminal elements, positioned within the first holes and configured to be electrically connected to corresponding connection regions. The first holes are sized to allow the insulative support member to be slidably removed from and replaced on the terminal elements after the terminal elements are connected to the connection regions. This allows visual inspection of connections between the terminal elements and connection regions. In order to retain the socket terminals within the socket support member, the intercoupling component further includes a retaining sheet disposed over a surface of the socket support member. The retaining sheet has to be removed from the socket terminals after the socket terminals are connected to the array of connection regions to allow removal of the socket support member.

OBJECT OF THE INVENTION

The object of the present invention is to provide an improved removable housing for mounting electrical contact elements.

SUMMARY OF THE INVENTION

The invention resides in an assembly for mounting elongated electrical contact elements onto an integrated circuit package or printed circuit board. The assembly comprises a a base plate having a first surface and a multiplicity of recesses aligned with each other in the first surface. Each of the recesses is sized and configured to receive a respective one of the contact elements. The assembly also comprises first and second spaced apart supports extending from the base plate. The assembly also comprises first and second rods received by the first and second supports and supported parallel to each other. The first and second rods define an intervening slot aligned with the recesses. The assembly also comprises a multiplicity of the contact elements. One end of each of the contact elements is received in a respective one of the recesses. The contact elements are engaged by the first and second rods, whereby the contact elements are held in their respective recesses. The rods are removable from the first and second supports to permit the contact elements to be removed from the base plate.

According to one feature of the present invention, the assembly further comprises third and fourth spaced apart supports extending from the base plate and third and fourth rods. The third and fourth rods are received by the third and fourth supports and supported parallel to each other and perpendicular to the first and second rods. The third and fourth rods define an intervening slot aligned with one of the recesses and engage the contact element in the one recess. The third and fourth rods are removable from the third and fourth supports to release the one contact element.

The electrical contact elements can be any part of an electrical plug-and-socket connection, e.g., a pin grid array socket or the respective pin terminals. The expression "pin grid array" refers to a style of integrated circuit socket or pin-out with pins laid out on a square or rectangular grid with a separation of a predefined distance in each direction.

The rods can be any straight, or almost straight, stick, shaft, bar, staff etc., of plastic, metal, or other material or a combination of different materials.

In a preferred embodiment of the present invention the first support comprises a first projection formed on a first edge of the first surface. Hence, the support member stands out from close to the border of the first surface. However, it does not necessarily have to be the farthest part from the middle of the first surface. Correspondingly, the second support member comprises a second projection formed on a second edge of the first surface basically opposite of the first edge.

According to the present invention, the first and second supports hold the rod a predetermined distance over the first surface. Even so, the rod might also be placed to touch the first surface. For that reason, the first support contains a hole extending therethrough to support a first end of the first rod. The hole is formed to allow the rod to be moved in longitudinal direction. Thus, the cross-section of the rod and that of the hole basically correspond, only the size is slightly different. The cross-section of the rod might have a round, oval, triangular, rectangular or any other shape.

Correspondingly, the second support contains a respective opening which is configured to support the other end of the rod. The hole might be formed by a recess configured to receive one tip of the rod, alternatively, it might be formed as well by a hole extending through the entire second support.

According to the present invention there are several ways the assembly is configured to enable the rod to prevent the electrical contact elements from falling out of the recesses. For example, the rod can engage a recess provided in the electrical contact elements. Alternately, the ends of the electrical contact elements in the respective recesses have a larger diameter or width than the remainder of the length of the electrical contact elements. The rods engage the electrical contact elements in their narrower region adjacent to their wider end region.

Preferably, the base plate includes a mouth on its second surface, opposite the first surface. The mouth is in the form of a funnel or cone, in order to facilitate the accessibility of the electrical contact elements, e.g., for respective contact terminals to plug into the contact elements provided in the removable housing. Advantageously, the cone shape mouth provides a large catch area for blind mating.

In a preferred embodiment of the present invention, the size of the recesses is such that the electrical contact elements loosely fit inside, i.e., the electrical contact elements are able to move slightly inside the recesses, without falling out or changing their general position. If the electrical contact elements provided in the removable housing are soldered onto a contact pad of, e.g., printed circuit board (PCB), the contact elements are automatically centered in respect to the contact pad, because of the surface tension of the melted solder material.

In a further embodiment of the mounting system, some or all of the rods are connected to each other at one end basically forming a comb where the rods form the teeth. Such an arrangement facilitates the handling of the rods and assists in taking the rods out of the assembly as a unit, when the electrical contact elements are intended to be released.

An advantage of the present invention lies in the fact that the removable housing is easy to remove or replace. This gives free access to solder joints for inspection, repair or cleaning operations. Furthermore, the removable housings and the rods or combs are reusable. Depending on the usage of the removable housing according to the present invention, they can be made of different materials. Thus, a different material might be used in a first step, when the contact elements are initially soldered onto respective connection pads. Later they can be easily exchanged by different housings of a different material.

DETAILED DESCRIPTION OF THE PREFERRED EMBODIMENT

Figure 1:
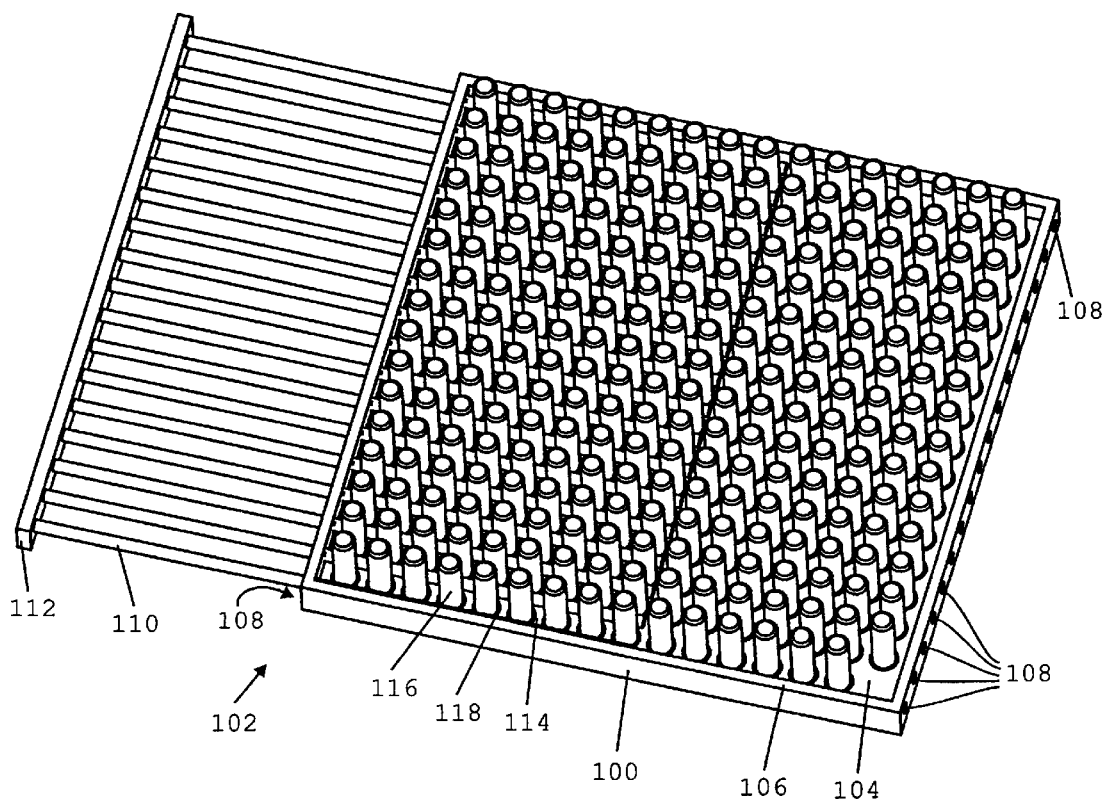
FIG. 1 shows a perspective bottom view of an embodiment of a removable housing and a mounting system, respectively, according to the present invention.

FIG. 1 illustrates a perspective bottom view of an embodiment of a removable housing 100 and a mounting system 102, respectively, both in accordance with the present invention. The removable housing is formed by a square shaped plate 104 which is surrounded by a frame 106 extending at right angles from the square shaped plate 104. On two sides of frame 106, being on opposite sides of square shaped plate 104, multiple holes 108 are provided which support multiple rods 110 extending through one hole towards another lying transversely across of square shaped plate 104. However, in the illustration according to FIG. 1, the rods are pulled half way out, so that they only reach half way to the opposite side over square shape plate 104. All rods are connected to each other at the end extending to the outside direction with respect of frame 106 by a bar 112.

Square shaped plate 104 shows multiple clear spaces 114 in which multiple electrical contact elements 116 are received. At the portion up to where electrical contact elements 116 are received by clear spaces 114 they are provided with a recess 118. Recess 118 engages with respective rod 110 being positioned next to the electrical contact element 116 in question, in order to prevent it from falling out of clear space 114. Hence, electrical contact elements 116 sitting in the area in which the rods are extending, are still locked, whereas the others are already released and might be taken out of removable housing 100.

Clear spaces 114 are arranged in multiple lines and holes 108 are configured to support rods 110 so that the projections of rods 110 onto the surface of square shaped plate 104 basically run between two neighboring lines of clear spaces 114. Thus, each rod 110 held by respective holes 108 engages with multiple contact elements 116 and keeps them sitting in clear spaces 114. As it can be seen in the illustration according to FIG. 1, removable housing 100 is configured to hold multiple rods 110 positioned in parallel, so that they run side by side with each another at a predetermined distance adjacent to electrical contact elements 116.

Figure 2:
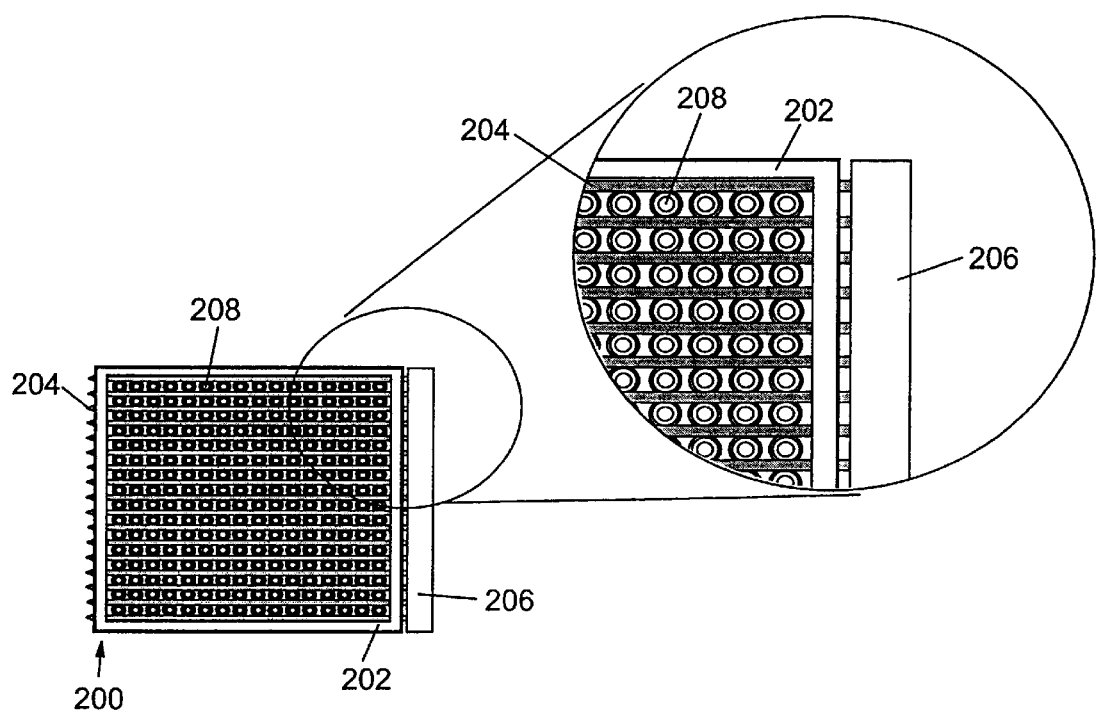
FIG. 2 shows a bottom view of the removable housing according to FIG. 1 and an enlargement of a detail of the bottom view.

In FIG. 2, there is shown a bottom view of a removable housing 200 according to FIG. 1 and an enlargement of a detail of the bottom view. Removable housing 200 again comprises a square shaped plate surrounded by a frame 202 providing means for supporting multiple rods 204 in form of a number of holes formed in two sides of frame 202. Rods 204 are on one end connected to each other by a bar 206, whereas the other end of the rods are extending transversely across the square shaped plate of removable housing 200 to be supported by respective holes provided in frame 202. As shown in FIG. 1, a plurality of electrical contact elements 208 are received by holes provided in the square shaped plate of removable housing 100.

The outside shape of electrical contact elements 208 is typically rotationally symmetrical and includes different diameters. As shown in the enlargement of a detail of the bottom view, the outer circle of the electrical contact elements is partly covered by adjacent rod 204, so that a part of the electrical contact elements having a smaller diameter is placed directly next to the respective rod. Thus, the difference in the diameter forms a step or recess in which the rod is placed. In the same way the rod engages with the respective electrical contact elements to keep them staying in the removable housing.

Figure 3:
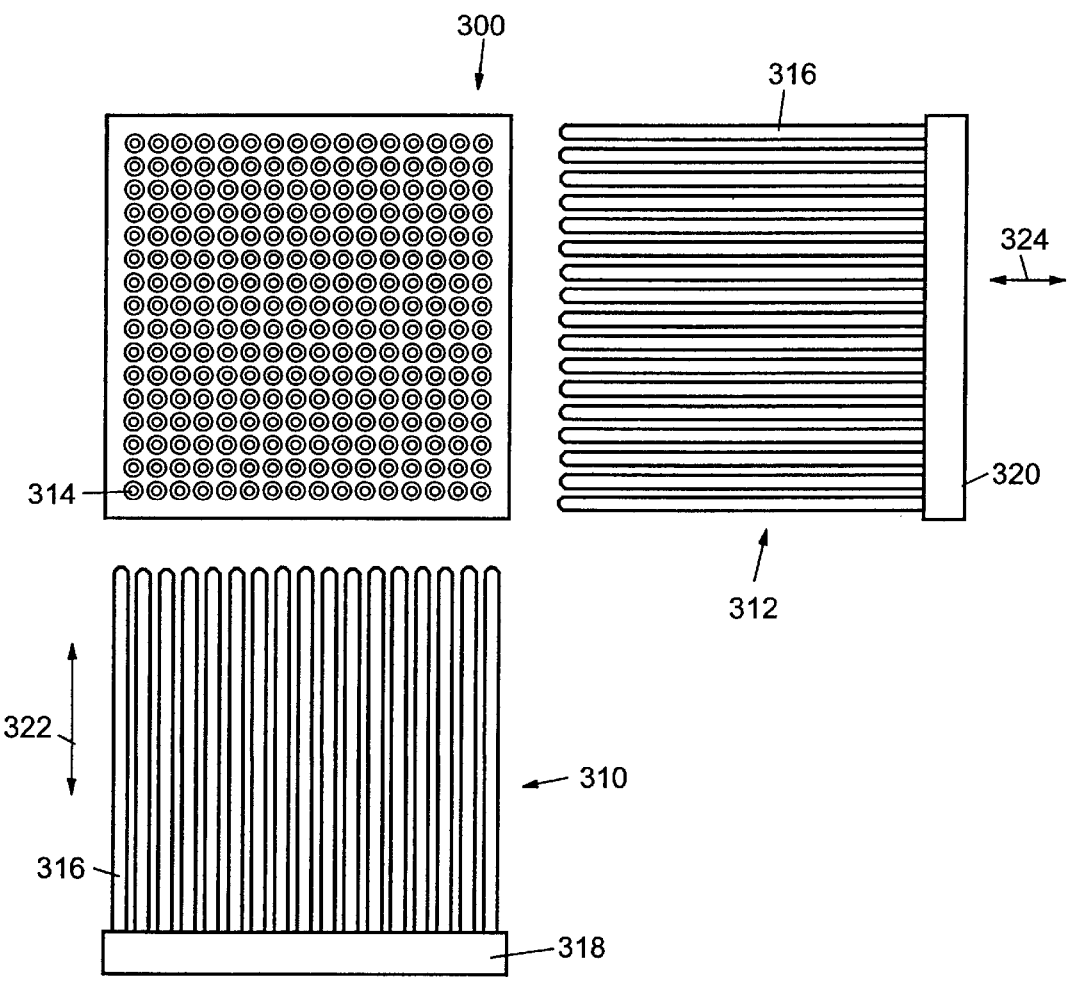
FIG. 3 shows a disassembled view of another embodiment of a removable housing and a mounting system, respectively, according to the present invention.

Now with reference to FIG. 3, there is depicted a disassembled view of another embodiment of a removable housing and a mounting system, respectively. The major difference to the embodiment described above is the fact that, in the FIG. 3 embodiment, a first set of rods 310 and a second set of rods 312 are used to hold electrical contact elements 314. Rods 316 of each set of rods are mechanically connected to each other by a first bar 318 and a second bar 320, respectively. Thus, the arrangement of rods and bar forming a comb-like structure wherein bar 318 holding rods 316 is forming the base of the comb and rods 316 are forming the teeth.

The first set of rods 310 can be moved in and out of the removable housing in the direction indicated by arrow 322. Correspondingly, the second set of rods 312 can be moved in and out of the removable housing in the direction indicated by arrow 324.

Figure 4:
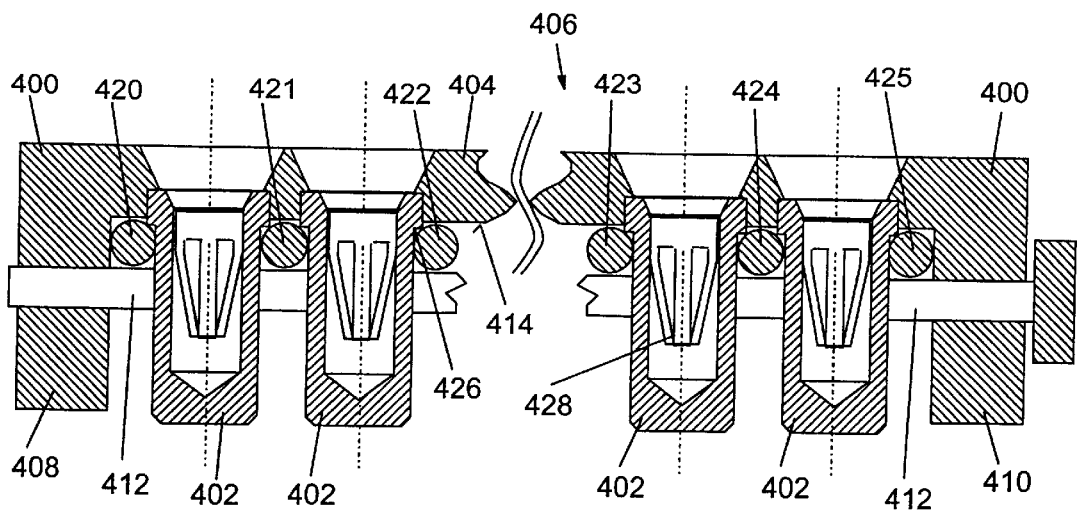
FIG. 4 shows a cross section of the removable housing according to the embodiment of FIG. 3 in an assembled state.

Next with reference to FIG. 4, there is shown a cross section of a removable housing 400 according to the embodiment of FIG. 3 in an assembled state. For the sake of clarity, only the outer portions of the cross section are displayed, both being configured to carry two electrical contact elements 402. The electrical contact elements are formed by pin grid array socket for mounting on the surface of an electrical contact pad (not shown). The housing comprises a first portion 404 basically in form of a plate. First portion 404 contains multiple recesses 406, each configured to receive one of electrical contact elements 402. As it can be seen in FIG. 4, only a small portion of electrical contact elements 402 are actually supported by first portion 404 of housing 400.

Furthermore, removable housing 400 comprises a first support member 408 and a second support member 410 configured to support at least one rod 412 to prevent electrical contact elements 402 from falling out of recesses 406. The rod is formed by a straight, round shaft. First support member 408 projects from an edge of first portion 404 of removable housing 400. Correspondingly, second support member 410 projects from another edge of first portion 404, basically opposite of the other edge. Furthermore, support members 408 and 410 basically extend at right angles from first portion 404 of removable housing 400.

First and second support members 408 and 410 hold rod 412 in place so that it runs with a predetermined distance over surface 414 of the first portion. For this reason both contain a hole extending through support members 408 and 410 respectively. The hole is formed to allow the rod to be moved in longitudinal direction.

Removable housing 400 is further configured to hold a second set of rods comprising rods 420 to 425. The second set of rods is supported by a third and a fourth support member (not shown) formed on first surface 414. The third and fourth support member are configured to support the second set of rods to run crosswise over rod 412. The rods of the second set and rod 412 work together to prevent the electrical contact elements from falling out of the recesses. In the embodiment shown in FIG. 4, rod 414 crosses rods 420 to 425 of the second set at right angles.

Rods 420 to 425 of the second set are supported in a position in which they engage with a recess 426 provided at electrical contact elements 402, whereby the recess is formed by a change in the diameter of the electrical contact elements. Furthermore, rods 420 to 425 are supported in a way that its shape partly overlaps the adjacent recesses 406 in the direction in which electrical contact elements 402 are put into recesses 406. In the present case, electrical contact elements 402 have a smaller diameter in the lower portion which is arranged close to one of rods 420 to 425.

Recesses 406 formed in first portion 404 of removable housing 400 extend through first portion 404. However, the inner shape of deepening 404 ensures that electrical contact elements 402 cannot slip through the deepening. Furthermore, the opening of recesses 406 formed by the extended deepening provides a mouth.

The size of the recesses 406 is configured in a way that electrical contact elements 402 loosely fit inside such that electrical contact elements 402 can move slightly inside recesses 406 but without falling out or changing their general position.

Electrical contact element 402 is formed by a small case or metal sleeve being prepared to receive a pin terminal of, e.g., an integrated circuit package (not shown). In the hollow part of contact element 402, four contact springs 428 are arranged which ensure a reliable electrical contact between the pin terminal and electrical contact element 402.

Figure 5:
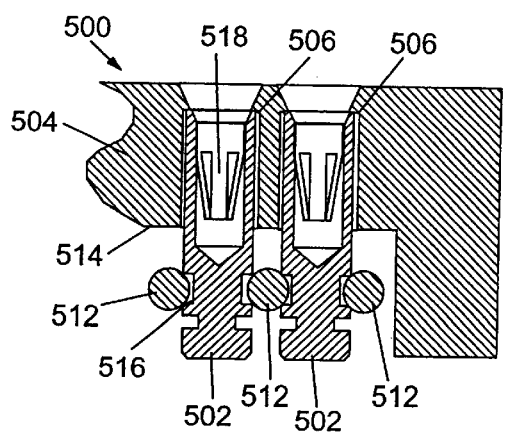
FIG. 5 shows a portion of a cross section of the removable housing according to the embodiment shown in FIGS. 1 and 2 having electrical contact elements of a first kind.

FIG. 5 shows a portion of a cross section of a removable housing 500 according to the embodiment shown in FIGS. 1 and 2 having electrical contact elements 502 of a first kind. The electrical contact elements are formed by pin grid array socket for mounting on the surface of an electrical contact pad (not shown).

Removable housing 500 comprises a first portion 504 basically in form of a plate. First portion 504 contains multiple bores 506, each configured to receive one of electrical contact elements 502. As it can be seen in FIG. 5, nearly a third of the length of electrical contact elements 502 is actually supported by first portion 504 of housing 500. Removable housing 500 comprises a first and second support member (not shown) to support rods 512 to prevent electrical contact elements 502 from falling out of bores 506. The rods are formed by a straight, round shaft.

The first and second support member (not shown) hold rods 512 in place so that they run with a predetermined distance over a surface 514 of first portion 504. Rods 512 are supported in a position in which they engage with a recess 516 provided at electrical contact elements 502, whereby the recess is formed by a change in the diameter of the electrical contact elements.

Electrical contact element 502 is formed by a small case or metal sleeve being prepared to receive a pin terminal of, e.g., an integrated circuit package (not shown). In the hollow part of contact element 502, four contact springs 518 are arranged which ensure a reliable electrical contact between the pin terminal and electrical contact element 502.

Figure 6:
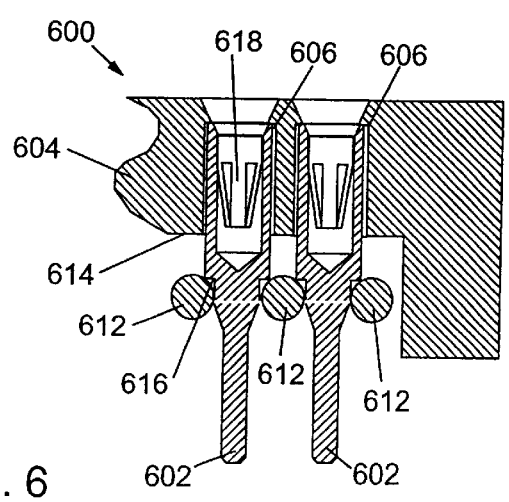
FIG. 6 shows a portion of a cross section as in FIG. 5 and electrical contact elements of a second kind.

Finally, with reference to FIG. 6, there is depicted a portion of a cross section as in FIG. 5 and electrical contact elements of a second kind. The electrical contact elements are formed by pin grid array socket for "pin-in-hole" mounting on, e.g., a printed circuit board (not shown).

Removable housing 600 comprises a first portion 604 having multiple bores 606, each configured to receive one of the electrical contact elements 602 and a first and second support member (not shown) to support rods 612 to prevent electrical contact elements 602 from falling out of bores 606. Rods 612 run with a predetermined distance over a surface 614 of first portion 604 and are supported in a position in which they engage with a recess 616 provided at electrical contact elements 602, whereby the recess is formed by a change in the diameter of the electrical contact elements.

Again, electrical contact elements 602 are formed by a small case or metal sleeve being prepared to receive a pin terminal of, e.g., an integrated circuit package (not shown). In the hollow part of contact element 602, four contact springs 618 are arranged which ensure a reliable electrical contact between the pin terminal and electrical contact element 602. As it can be seen in the drawing of FIG. 6, the bores are formed so that the electrical contact elements loosely fit inside such that the electrical contact elements can move slightly inside their recesses but without falling out or changing their general position.

What is claimed is:

1. An assembly for mounting elongated contact elements, said assembly comprising:

a base plate having a first surface and a multiplicity of recesses aligned with each other in said first surface, each of said recesses being sized and configured to receive a respective one of said contact elements, first and second spaced apart supports extending from said base plate, and first and second rods received by said first and second supports and supported parallel to each other, said first and second rods defining an intervening slot aligned with said recesses;

a multiplicity of said contact elements, one end of each of said contact elements being received in a respective one of said recesses, said contact elements being engaged by said first and second rods, whereby said contact elements are held in their respective recesses; and wherein said rods are removable from said first and second supports to permit said contact elements to be removed from said base plate.

2. An assembly as set forth in claim 1 wherein said base plate further comprises a second multiplicity of recesses aligned with each other in said first surface, said second multiplicity of recesses being parallel to the first said multiplicity of recesses;

said assembly further comprises a third rod parallel to said first and second rods, received in said first and second supports and supported parallel to said first and second rods, said second and thirds rods defining an intervening second slot aligned with said second multiplicity of recesses;

a second multiplicity of said contact elements, one end of each of said second multiplicity of contact elements being received in a respective one of said second multiplicity of recesses, said second multiplicity of contact elements being engaged by said second and third rods, whereby said second multiplicity of contact elements are held in their respective recesses; and wherein said second and third rods are removable from said first and second supports to permit said second multiplicity of contact elements to be removed from said base plate.

3. An assembly as set forth in claim 1 wherein said first support comprises a first projection formed on a first edge of said first surface, and said second support comprises a second projection formed on a second, opposite edge of said first surface.

4. An assembly as set forth in claim 1 wherein said first support contains a first hole sized and configured to receive one end of said first rod, said second support contains a second hole sized and configured to receive another end of said first rod, said first rod being slidably removable from said first and second holes; and said first support further contains a third hole sized and configured to receive one end of said second rod, said second support further contains a fourth hole sized and configured to receive another end of said second rod, said second rod being slidably removable from said third and fourth holes.

5. The assembly as set forth in claim 1 further comprising third and fourth spaced apart supports extending from said base plate and third and fourth rods, said third and fourth rods received by said third and fourth supports and supported parallel to each other and perpendicular to said first and second rods, said third and fourth rods defining an intervening slot aligned with one of said recesses, said third and fourth rods engaging the contact element in said one recess; and wherein said third and fourth rods are removable from said third and fourth supports to release said one contact element.

6. An assembly according to claim 1 wherein each of said contact elements has a larger diameter or width at its end which is received in the respective recess than at its other end, and said first and second rods engage said contact element on a region of said contact element that is narrower than and adjacent to said enlarged diameter or width end to hold said contact element in said recess.

7. An assembly as set forth in claim 1 wherein each of said contact elements has an annular recess, and said first and second rods engage said contact element within said annular recess to hold said contact element in its respective recess.

8. An assembly as set forth in claim 1 wherein said recessess are sized to loosely hold the respective contact elements.

9. An assembly as set forth in claim 1 wherein said first and second rods are connected to each other such they can be removed from the first and second supports as a unit.

10. An assembly as set forth in claim 1 wherein said base plate has a second surface opposite the first surface, said second surface having a second multiplicity of recesses which are aligned with and respectively communicate with the first said multiplicity of recesses in the first surface.

11. An assembly as set forth in claim 10 wherein said second multiplicity of recesses are funnel shaped, wider at the second surface than within said base plate.

12. An assembly for applying elongated contact elements, said assembly comprising:

a base plate having a first surface and a multiplicity of recesses arranged as a grid of rows and columns in said first surface, each of said recesses being sized and configured to receive a respective one of said contact elements, first and second spaced apart supports extending from said base plate, third and fourth spaced apart supports extending from said base plate, a first multiplicity of rods received by said first and second supports and supported parallel to each other, said first multiplicity of rods defining intervening slots aligned with respective rows of said recesses;

a second multiplicity of rods received by said third and fourth supports and supported parallel to each other, said second multiplicity of rods defining intervening slots aligned with respective columns of said recesses;

a multiplicity of said contact elements, one end of each of said contact elements being received in a respective one of said recesses, each of said contact elements being engaged by two adjacent rods of said first multiplicity and two adjacent rods of said second multiplicity, whereby said contact elements are held in their respective recesses; and wherein said first multiplicity of rods are removable from said first and second supports and said second multiplicity of rods are removable from said third and fourth supports to permit said multipicity of contact elements to be removed from said base plate.

13. An assembly as set forth in claim 9 wherein said first support comprises a first projection formed on a first edge of said first surface, said second support comprises a second projection formed on a second edge of said first surface opposite said first edge, said third support comprises a third projection formed on a third edge of said first surface, and said fourth support comprises a fourth projection formed on a fourth edge of said first surface opposite said third edge.

14. An assembly according to claim 9 wherein each of said contact elements has a larger diameter or width at its end which is received in the respective recess than at its other end, and said rods engage said contact elements on regions of said contact elements that are narrower than and adjacent to said enlarged diameter or width end to hold said contact elements in said recess.

* * * * *